United States Patent
Murakami (10) Patent No.: US 6,599,777 B2
(45) Date of Patent: Jul. 29, 2003

(54) METHOD FOR MOUNTING FLIP CHIP ON CIRCUIT BOARD THROUGH RELIABLE ELECTRICAL CONNECTIONS AT LOW CONTACT RESISTANCE

(75) Inventor: Tomoo Murakami, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/997,686

(22) Filed: Nov. 29, 2001

(65) Prior Publication Data

US 2002/0068382 A1 Jun. 6, 2002

(30) Foreign Application Priority Data

Dec. 1, 2000 (JP) .................................. 2000-366899

(51) Int. Cl.⁷ .................. H01L 21/44; H01L 21/48; H01L 21/50; H01L 23/48; H01L 23/52; H01L 29/40; B23K 31/00; B23K 31/02

(52) U.S. Cl. ............. 438/108; 438/127; 438/666; 257/778; 228/180.22

(58) Field of Search ............... 438/127, 666, 438/686, 108; 257/778; 228/180.22

(56) References Cited

U.S. PATENT DOCUMENTS 6,326,241 B1 * 12/2001 Belke, Jr. et al. ............ 438/118
6,410,415 B1 * 6/2002 Estes et al. ................. 438/612
6,461,896 B1 * 10/2002 Imasu et al. ................ 438/108

* cited by examiner

Primary Examiner—Wael Fahmy
Assistant Examiner—Nema O. Berezny
(74) Attorney, Agent, or Firm—Choate, Hall & Stewart (57) ABSTRACT

A flip chip is mounted on a printed circuit board, and bump electrodes and pads are established in electrical connection, wherein sealing resin between the flip chip and the printed circuit board is thermally cured for pressing the bump electrodes against the pads and, thereafter, the bump electrodes are alloyed with the pads so that not only the force but also the alloyed portion keep the electrical connection low in contact resistance without disconnection.

24 Claims, 5 Drawing Sheets

Fig. 5

METHOD FOR MOUNTING FLIP CHIP ON CIRCUIT BOARD THROUGH RELIABLE ELECTRICAL CONNECTIONS AT LOW CONTACT RESISTANCE

FIELD OF THE INVENTION

This invention relates to a semiconductor device fabricating technology and, more particularly, to a method for mounting a flip chip on a circuit board.

DESCRIPTION OF THE RELATED ART

Electronic devices have been continuously miniaturized, and high-density assembling technologies are being still developed. A flip chip mounting technology is one of the high-density assembling technologies, and is attractive to the manufacturers from the viewpoint of simplification.

In order to mount flip chips on a substrate, various methods have been proposed. The prior art methods disclosed in Japanese Patent Nos. 1689504 and 2770821 are categorized in the pressure mounting technology. The pressure mounting technology requires neither solder nor conductive resin. A flip chip is mounted on a printed circuit board in such a manner that the electrodes of the flip chip are held in contact with the conductive pads on the printed circuit board. Sealing resin has been already spread over the printed circuit board, and heat and pressure are applied so as to cure the sealing resin. The sealing resin is shrunk, and the shrunk sealing resin presses the electrodes to the pads. Thus, the flip chip is fixed onto the printed circuit board without any solder or conductive resin.

Description is hereinbelow made on the prior art method disclosed in Japanese Patent No. 1689504 with reference to FIGS. 1A and 1B. The method starts with preparation of a printed circuit board 1 and a semiconductor element 4. A conductive wiring pattern 10 has been already formed on the printed circuit board 1, and the semiconductor element 4 has metal bumps 11. Synthetic resin 12 is spread over an area on the printed circuit board 1 where the semiconductor element 4 is to be mounted. The conductive wiring pattern 10 and an exposed surface of the printed circuit board 1 are covered with the synthetic resin layer 12. The synthetic resin may be spread over the lower surface of the semiconductor element 4. The synthetic resin is, by way of example, epoxy resin, and is provided in either liquid or a piece of foil. The synthetic resin is insulating, and is of the type thermally cured or photo-cured.

Figure 1A:
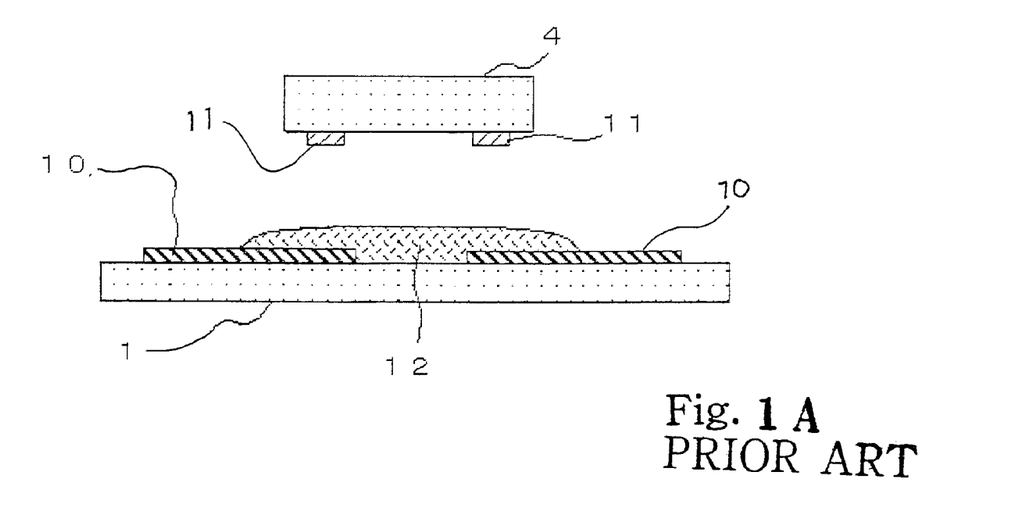
FIGS. 1A and 1B are schematic views showing the prior art method for mounting a flip chip on a printed circuit board.
Figure 1B:
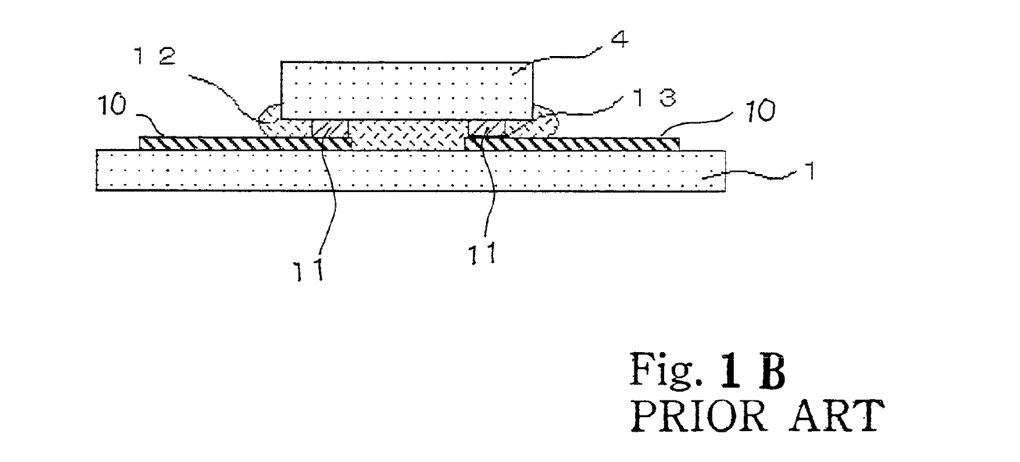

Subsequently, the semiconductor element 4 is conveyed to the space over the printed circuit board 1, and the bumps 11 are aligned with the conductive wiring pattern 10 as shown in FIG. 1A.

The semiconductor element 4 is downwardly moved. The metal bumps 11 penetrate through the synthetic resin layer 12, and reach the conductive wiring pattern 10. Thus, the metal bumps 11 are brought in contact with the conductive wiring pattern 10.

Heat is applied to the synthetic resin layer 12, or light is radiated to the synthetic resin layer 12. Then, the synthetic resin layer 12 is cured, and is shrunk as shown in FIG. 1B. The synthetic resin thus cured presses the semiconductor element 4 downwardly, and the metal bumps 11 are pressed against the conductive wiring pattern 10.

Although the semiconductor element 4 is mounted on the printed circuit board 1 without any solder or conductive resin through the prior art method as described hereinbefore, a problem is encountered in the resultant semiconductor device in that disconnection is liable to take place between some metal bumps 11 and the conductive wiring pattern 10. The disconnection is due to a small amount of synthetic resin left on the conductive wiring pattern 10 as indicated by reference numeral 13 in FIG. 1B. While the semiconductor element 4 is being downwardly moved, the metal bumps 11 push the synthetic resin aside. When the metal bumps 11 reach the conductive wiring pattern 10, most of the synthetic resin is evacuated from the upper surface of the conductive wiring pattern 10. However, there remains a small amount of synthetic resin, and the small amount of synthetic resin forms an extremely thin synthetic resin layer 13 between the conductive wiring pattern and some metal bumps 11. The synthetic resin is insulating, and the disconnection takes place between the bumps 11 and the conductive wiring pattern 10.

A solution is proposed in Japanese Patent No. 2770821. According to the prior art method disclosed in the Japanese Patent, sharp tails have been formed on the lower surfaces of the metal bumps 11 before mounting the semiconductor element on the printed circuit board.

While the semiconductor element 4 is being downwardly moved, the sharp tails proceed through the synthetic resin layer. The sharp tails firstly reach the conductive wiring pattern 10. The semiconductor element is further moved downwardly, and the sharp tails are crushed on the conductive wiring pattern. When the sharp tails expand on the conductive wiring pattern, the synthetic resin is perfectly evacuated from the conductive wiring pattern, and the metal bumps are surely held in contact with the conductive wiring pattern. Thus, the sharp tails permit the metal bumps to form the electrical connections between the metal bumps and the conductive wiring pattern.

Finally, the synthetic resin is thermally cured or photo-cured, and the metal bumps are pressed against the conductive wiring pattern by virtue of the shrinkage of the synthetic resin.

Thus, the semiconductor element is electrically connected to the conductive wiring pattern without any solder or conductive resin, and the probability of disconnection between the metal bump and the conductive wiring pattern is little. However, a problem is encountered in the prior art semiconductor devices mounted through the prior art methods in a narrow field of application and a low reliability. Since the compressive force produced through the shrinkage of the synthetic resin keeps the metal bumps and the conductive wiring pattern held in contact with one another, the expansion of the synthetic resin due to high temperature environment removes the pressure from the contacts between the metal bumps and the conductive wiring pattern. When the pressure is removed from between the metal bumps and the conductive wiring pattern, the contact resistance therebetween is increased, and, accordingly, the amount of allowable current passing therethrough is decreased. Thus, the allowable current is smaller than that passing through a contact produced through an alloying. This means that the prior art methods are merely applicable to semiconductor devices, which operate on condition of a small current density at the contacts to the conductive wiring pattern. Further, the prior art methods are hardly applied to semiconductor devices, which are expected to operate in the high temperature environment. As a result, the field of application is narrowed.

The low reliability is due to aged deterioration of the synthetic resin. Even if the semiconductor devices mounted through the prior art methods are not expected to operate in the high temperature environment, the synthetic resin may be periodically subjected to a heat cycle. In this situation, the thermal stress is repeatedly exerted on the synthetic resin, and tends to lose the resiliency. This results in removal of the pressure from between the metal bumps and the conductive wiring pattern. The contact resistance is drastically increased, and some bumps are disconnected from the conductive wiring pattern.

SUMMARY OF THE INVENTION

It is therefore an important object of the present invention to provide a mounting method, which is applicable to a wide variety of application products at high reliability.

To accomplish the object, the present invention proposes to complete electrical connections through alloying.

In accordance with one aspect of the present invention, there is provided a method for mounting a semiconductor chip on a substrate comprising the steps of a) preparing a semiconductor chip having conductive electrodes and a substrate having conductive layers, the conductive electrodes and the conductive layers being formed of material capable of being alloyed with one another, b) pressing the conductive electrodes against the conductive layers by shrinking a sealing layer covering at least the conductive electrodes and the conductive layers, and c) alloying the material with each other for completing electrical connection between the conductive electrodes and the conductive layers.

BRIEF DESCRIPTION OF THE DRAWINGS

The features and advantages of the method will be more clearly understood from the following description taken in conjunction with the accompanying drawings in which.

DESCRIPTION OF THE PREFERRED EMBODIMENTS

A method for mounting a flip chip on a substrate starts with preparation of a flip chip and a substrate. Bump electrodes are formed on the reverse surface of the flip chip, and conductive pads are formed on the major surface of the substrate. The bump electrodes and the conductive pads are respectively formed of suitable sorts of metal to be alloyed with one another. Sharp tails may be formed on the contact surfaces of the bump electrodes. The substrate has a mounting area where the conductive pads occupy.

Subsequently, thermally curable synthetic resin is provided on at least one of the mounting area and the reverse surface of the flip chip. The thermally curable synthetic resin is in liquid or in the form of foil. The thermally curable synthetic resin may be in the epoxy series. Photo-curable synthetic resin is available for the method according to the present invention. In this instance, the photo-curable synthetic resin is provided on at least one of the mounting area and the reverse surface of the flip chip.

Subsequently, the flip chip is moved into the space in the vicinity of the mounting area, and the bump electrodes are aligned with the conductive pads. Force is exerted on the flip chip so as to press the bump electrodes against the conductive pads, and heat is applied to the thermally curable synthetic resin. Then, the synthetic resin is cured, and is shrunk. In case where the photo-curable synthetic resin is used, the synthetic resin is exposed to light so as to be cured, and is also shrunk during the exposure to the light. The bump electrodes are forcibly or mechanically held in contact with the conductive pads.

Subsequently, the metal forming the bump electrodes is alloyed with the metal forming the conductive pads. Heat may be applied to the bump electrodes and the conductive pads under application of force. The bump electrodes are merged into the conductive pads through the alloying. The contact resistance between the bump electrodes and the conductive pads is much lower than that between the bumps 11 and the conductive wiring pattern 10, and is much reliable rather than the contacts between the bumps 11 and the conductive wiring pattern 10.

First Embodiment

FIGS. 2A to 2F show a method embodying the present invention for mounting a flip chip on a substrate. The method starts with preparation of a printed circuit board 1 and a flip chip 4 (see FIG. 2A). Pads 8 are connected to circuit components (not show), and bump electrodes 5 are formed on the pads 8. Sharp tails 5a project from the bump electrodes 5. The printed circuit board 1 is fabricated through a build-up process, and is formed with a conductive wiring pattern. Pads 3 form parts of the conductive wiring pattern. A solder resist layer 2 is formed on the printed circuit board 1, and the pads 3 are exposed to the hollow spaces formed in the solder resist layer 2.

Figure 2A:
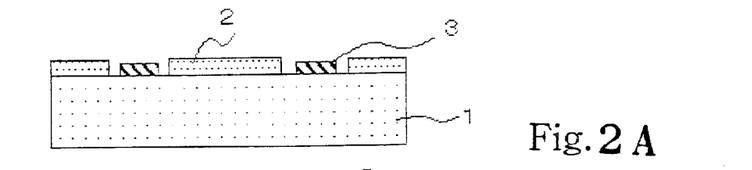
FIGS. 2A to 2F are schematic views showing a method for mounting a flip chip on a substrate according to the present invention.

The bump electrodes 5 with the sharp tails 5a and the pads 3 are formed of conductive metal and/or conductive alloy, and the metal/alloy for the bump electrodes 5 and the metal/alloy for the pads 3 are to be alloyed with one another through a thermal diffusion step. Ductility is required for the metal/alloy for the bump electrodes 5 as will be described hereinlater. In this instance, the bump electrodes 5 with the sharp tails 5a are formed of gold, and the pads 3 are formed from the lamination of a copper film, nickel film and god film. Firstly, the copper film is formed. The copper film is plated with the nickel film of 5 microns thick, which in turn is plated with the gold film of 0.1 micron thick. These kinds of metals are an example. Other kinds of metal/alloy are available for the bumps 5 and the pads 3 in so far as they satisfy the above-described conditions.

Figure 2B:
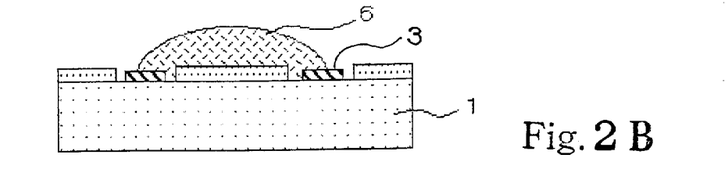

Subsequently, sealing resin 6 is provided on the mounting area on the printed circuit board 1, and the sealing resin 6 is formed in a generally semispherical configuration due to the surface extension as shown in FIG. 2B. In this instance, the sealing resin 6 is supplied to the mounting area by using a dispenser. The dispenser leaves a drop of sealing resin 6 on the mounting area. Of course, the sealing resin 6 may be supplied to the mounting area through any other technique.

The sealing resin 6 is thermally curable. In other words, the sealing resin 6 is to be immediately cured when heat is applied. It is preferable that the sealing resin 6 has the coefficient of contraction greater than the coefficient of thermal expansion. In this instance, the sealing resin 6 is selected from the epoxy series. The sealing resin 6 is cured at 200 degrees in centigrade for 30 seconds.

Figure 2C:
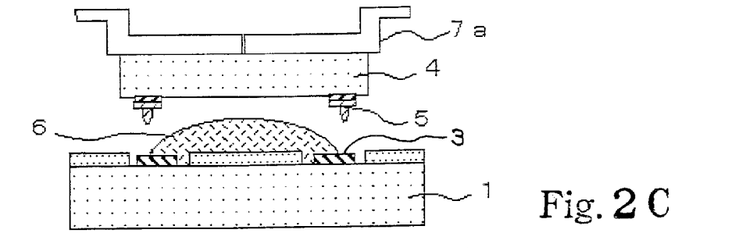

Subsequently, the flip chip 4 is held by a heating tool 7a. The heating tool 7a keeps the flip chip 4 in such a manner that the bump electrodes 5 downwardly project, and the flip chip 4 is conveyed to a space over the printed circuit board 1 as shown in FIG. 2C. In this instance, a constant heating type mounting system is used in this step. However, any other mounting system is available. The flip chip 4 is heated by the heating tool 7a, and the printed circuit board 1 is also heated by a suitable heating means. In this instance, the flip chip 4 is heated to 200 degrees in centigrade, and the printed circuit board 1 is heated to 80 degrees in centigrade. The temperatures are merely as an example.

The heating tool 7a makes the bump electrodes 5 aligned with the pads 3, and is moved downwardly. The bumps 5 with the sharp tails 5a proceeds toward the pads 3 through the sealing resin 6. The sharp tails 5a are firstly brought into contact with the pads 3, and is crushed on the pads 3. Subsequently, the bump electrodes 5 reach the pads 3, and are also crushed on the pads 3. Thus, the heating tool 7a continuously exerts the force on the flip chip 4 until the bumps 5 are spread on the pads 3 to a certain degree. In this instance, the force exerted on each bump electrode 5 is of the order of 30 grams, and the bump electrodes 5 are reduced in height from 100 microns to about 60 microns. The application of heat is continued. In this instance, the flip chip 4 and the printed circuit board 1 are respectively heated at about 200 degrees in centigrade and about 80 degrees in centigrade, and the application of heat is continued for 30 seconds. The sealing resin 6 is thermally cured, and is shrunk. The sealing resin 6 thus shrunk presses the bump electrodes 5 against the pads 3, and makes the bump electrodes 5 mechanically held in contact with the pads 3 as shown in FIG. 2D.

Although the prior art mounting method is completed at the step shown in FIG. 2D, the mounting method according to the present invention proceeds as follows. The flip chip 4 mounted on the printed circuit board 1 is conveyed to a heat pressing machine. The flip chip 4 is heated and pressed against the printed circuit board 1 by using a heating block 9 as shown in FIG. 2E. The force exerted on the flip chip 4 restricts the thermal expansion of the sealing resin 6. In this instance, the force exerted on each bump electrode 5 is of the order of 50 grams. While the flip chip 4 is being pressed against the printed circuit board 1, the flip chip 4 and the printed circuit board 1 are respectively heated to 300 degrees in centigrade and 100 degrees in centigrade for 5 seconds. The aligning capability is not required for the heat pressing machine, and is simpler than the above-described mounting system. Only the heating capability and pressing capability are required for the heat pressing machine, and such a simple heat pressing machine is commercially obtainable in the market.

Figure 2D:
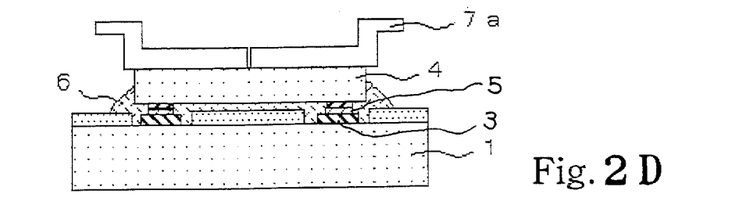
Figure 2E:
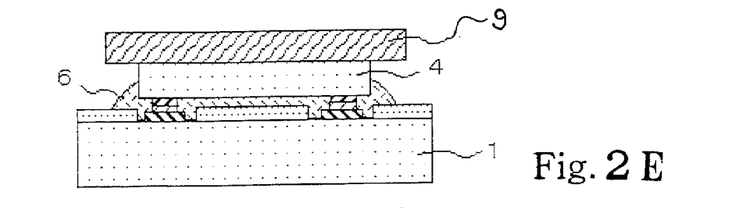
Figure 2F:
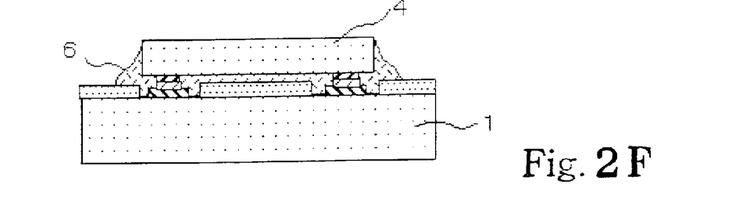

While the flip chip 4 and the printed circuit board 1 are being heated and pressed, the gold bump electrodes 5 and the god films of the pads 3 are thermally diffused each other, and the bump electrodes 5 and the pads 3 are alloyed as shown in FIG. 2F. Thus, not only the sealing resin 6 but also the allowed portions keep the bump electrodes 5 and the pads 3 held in contact with one another, and the contact resistance therebetween is as low as the contact resistance at the prior art alloyed portions. The contact between each bump electrode 5 and the associated pad 3 is more reliable than the contact between the bump 11 and the conductive wiring pattern 10. For this reason, the method according to the present invention is applicable to various kinds of electric devices. In other words, the method finds a wide filed of application.

Figure 3A:
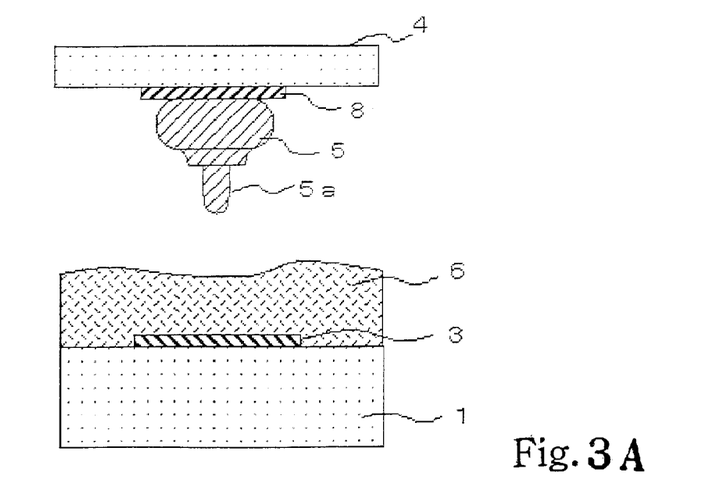
FIGS. 3A to 3C are schematic views showing a sharp tail crushed on a conductive pad in the method.
Figure 3B:
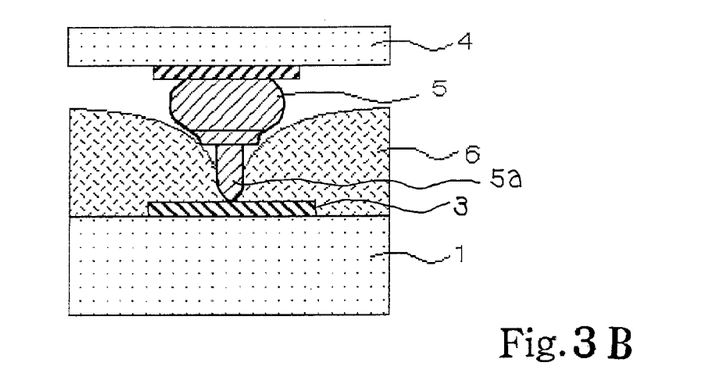
Figure 3C:
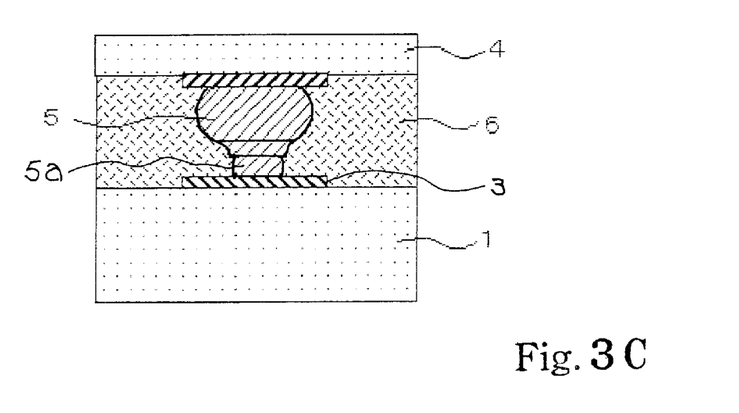

FIGS. 3A to 3C is focused on one of the bump electrode 5 with the sharp tail 5a in the steps shown in FIGS. 2C and 2d. When the heating tool 7a starts to advance the flip chip 4 toward the printed circuit board 1, the sharp tail 5a is spaced from the sealing resin layer 6 as shown in FIG. 3A. The sharp tail 5a firstly reaches the sealing resin layer 6, and pushes the sealing resin 6 aside during the downward motion of the flip chip 4 as shown in FIG. 3B. The sharp tail 5a reaches the pad 3 at the tip thereof. Any synthetic resin 6 is not left between the tip and the pad 3. The flip chip 4 is continuously moved downwardly, and the sharp tail 5a is gradually crushed on the pad 3. While the sharp tail 5a is being crushed, the tail 3 is sidewardly expanded, and pushes the sealing resin 6 aside. Thus, the sealing resin 6 is swept away, and the crushed tail 5a is surely held in contact with the pad 3 as shown in FIG. 3C. Thus, the sharp tail 5a is preferable, and prevents the bump electrode 5 and the pad 3 from the disconnection due to the residual sealing resin therebetween. Thereafter, the sealing resin 6 is thermally cured, and the heat and the pressure are applied to the flip chip 4 for alloying as described hereinbefore.

As will be understood from the foregoing description, the cured sealing resin causes the bump electrodes 5 and the pads 3 forcibly to be held in contact with each other, and, thereafter, the bump electrodes 5 and the pads 3 are alloyed with one another. The bump electrodes 5 and the pads 3 are established in the electrical connection by virtue of the alloyed portions as well as the force exerted therebetween. For this reason, the contact resistance is low enough to flow a large amount of current, and the electrical connection is reliable.

Even though the sealing resin 6 reduces the force exerted on the bump electrodes 5 in high temperature environment, the alloyed portion keeps the contact resistance low. Thus, the method according to the present invention is applicable to electric devices operative in the high temperature environment.

The alloyed portion is hardly separated, and the electrical connection is highly reliable.

Another advantage of the method according to the present invention is reduction in cost. The prior art alloying method consumes a large mount of noble metal in order to obtain a thick alloyed portion. On the other hand, the alloyed portion cooperates with the cured sealing resin 6 for the electrical connections. This means that the electrical connection is maintained even if the alloyed portion is relatively thin.

Second Embodiment

FIGS. 4A to 4E show another method embodying the present invention. A pulse heating type flip chip mounting system is used in the method implementing the second embodiment. Using the pulse heating type flip chip mounting system, the manufacturer can appropriately vary the temperature on the flip chip and force exerted thereon. For this reason, the method does not require any heating press machine.

Figure 4A:
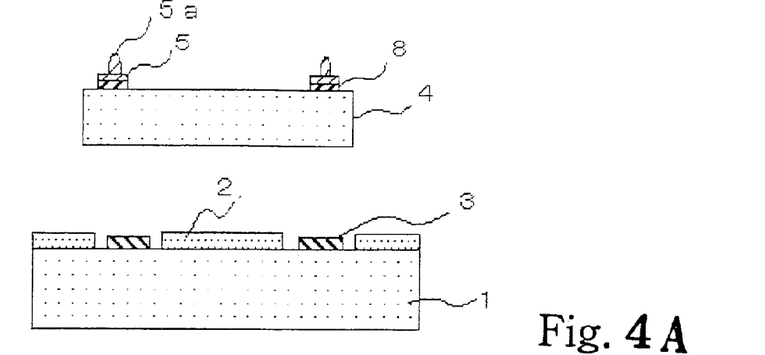
FIGS. 4A to 4E are schematic views showing another method for mounting a flip chip on a substrate according to the present invention.

The method starts with preparation of a printed circuit board 1 and a flip chip 4 (see FIG. 4A). Pads 8 are connected to circuit components (not show), and bump electrodes 5 are formed on the pads 8. Sharp tails 5a project from the bump electrodes 5. The printed circuit board 1 is fabricated through a build-up process, and is formed with a conductive wiring pattern. Pads 3 form parts of the conductive wiring pattern. A solder resist layer 2 is formed on the printed circuit board 1, and the pads 3 are exposed to the hollow spaces formed in the solder resist layer 2.

The bump electrodes 5 with the sharp tails 5a and the pads 3 are formed of conductive metal and/or conductive alloy, and the metal/alloy for the bump electrodes 5 and the metal/alloy for the pads 3 are to be alloyed with one another through a thermal diffusion step. Ductility is required for the metal/alloy for the bump electrodes 5 as will be described hereinlater. In this instance, the bump electrodes 5 with the sharp tails 5a are formed of gold, and the pads 3 are formed from the lamination of a copper film, nickel film and god film. Firstly, the copper film is formed. The copper film is plated with the nickel film of 5 microns thick, which in turn is plated with the gold film of 0.1 micron thick. These kinds of metals are merely an example. Other kinds of metal/alloy are available for the bumps 5 and the pads 3 in so far as they satisfy the above-described conditions.

Figure 4B:
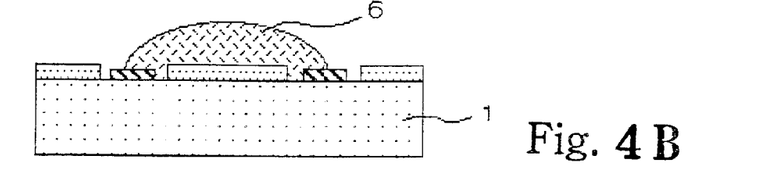

Subsequently, sealing resin 6 is provided on the mounting area on the printed circuit board 1, and the sealing resin 6 is formed in a generally semispherical configuration due to the surface extension as shown in FIG. 4B. In this instance, the sealing resin 6 is supplied to the mounting area by using a dispenser. The dispenser leaves a drop of sealing resin 6 on the mounting area. Of course, the sealing resin 6 may be supplied to the mounting area through any other technique.

The sealing resin 6 is thermally curable. In other words, the sealing resin 6 is to be immediately cured when heat is applied. It is preferable that the sealing resin 6 has the coefficient of contraction greater than the coefficient of thermal expansion. In this instance, the sealing resin 6 is selected from the epoxy series. The sealing resin 6 is cured at 200 degrees in centigrade for 30 seconds.

Figure 4C:
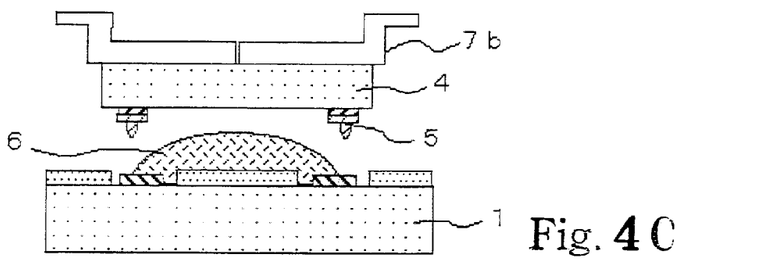

Subsequently, the flip chip 4 is held by a heating tool 7b. The heating tool 7b keeps the flip chip 4 in such a manner that the bump electrodes 5 downwardly project, and the flip chip 4 is conveyed to a space over the printed circuit board 1 as shown in FIG. 4C. The flip chip 4 is heated by the heating tool 7b, and the printed circuit board 1 is also heated by a suitable heating means. In this instance, the flip chip 4 is heated to 200 degrees in centigrade, and the printed circuit board 1 is heated to 80 degrees in centigrade. The temperatures are merely as an example.

The heating tool 7a makes the bump electrodes 5 aligned with the pads 3, and is moved downwardly. The bumps 5 with the sharp tails 5a proceeds toward the pads 3 through the sealing resin 6. The sharp tails 5a are firstly brought into contact with the pads 3, and are crushed on the pads 3. While the sharp tails 5a are being crushed, the crushed tails 5 push the sealing resin 6 aside, and, accordingly, is held in contact with the pads 3 without any residual sealing resin. Subsequently, the bump electrodes 5 reach the pads 3, and are also crushed on the pads 3. Thus, the heating tool 7a continuously exerts the force on the flip chip 4 until the bumps 5 are spread on the pads 3 to a certain degree. In this instance, the force exerted on each bump electrode 5 is of the order of 30 grams (see the time period between t1 and t3 in FIG. 5), and the bump electrodes 5 are reduced in height from 100 microns to about 60 microns.

Figure 4D:
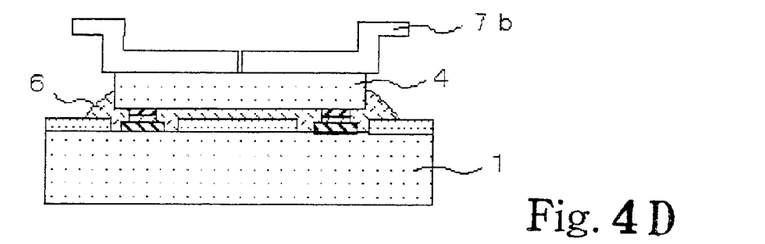
Figure 4E:
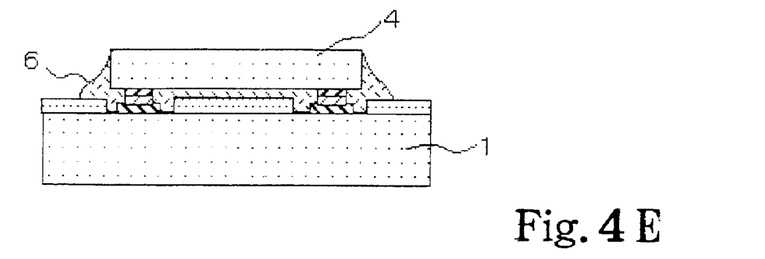
Figure 5:
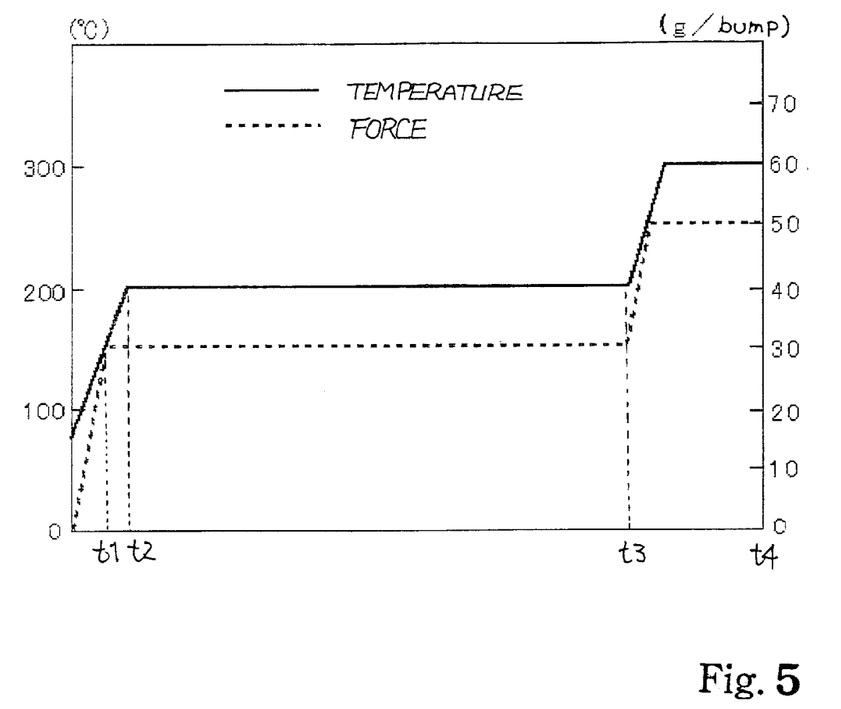
FIG. 5 is a diagram showing temperature profile at a bump electrode and force exerted thereon in terms of time.

The pulse heating type flip chip mounting system keeps the temperature on the flip chip 4 at 200 degrees in centigrade (see the time period between t2 and t3) and the printed circuit board 1 at 80 degrees in centigrade. The temperature and the force are maintained for 30 seconds. The sealing resin 6 is thermally cured, and is shrunk. The cured sealing resin 6 presses the bump electrodes 5 against the pads 3 so as to establish the bump electrodes 5 and the pads 3 in electrically connected state as shown in FIG. 4D.

Subsequently, the pulse heating type flip chip mounting system raises the temperature, and increases the force exerted on the bump electrodes 5. The force is increased to 50 grams so as to restrict the thermal expansion of the sealing resin 6 (see the broken line after time t3), and the temperature on the flip chip 4 is raised to 300 degrees in centigrade (see the real line after time t3). The temperature on the printed circuit board 1 is raised to 100 degrees in centigrade. The pulse heating type flip chip mounting system keeps the flip chip 4 and the printed circuit board 1 in the high-temperature high-pressure state for 5 seconds. The god bump electrodes 5 are alloyed through the thermal diffusion with the pads 3. The alloying is completed at time t4, and the bump electrodes 5 are strongly connected to the pads 3 at a low contact resistance.

The electrical connection exhibits a low resistance, and is reliable by virtue of the alloyed portion. Thus, the method implementing the second embodiment achieves the advantages of the method implementing the first embodiment. The advantages of the method implementing the first embodiment are described hereinbefore, and description on the advantages is omitted for avoiding repetition.

Furthermore, only the pulse heating type flip chip mounting system is required for the method implementing the second embodiment, and the mounting work is completed within a time period shorter than that in the mounting work in the first embodiment.

In the above-described embodiments, the bump electrodes 5 and the pads are corresponding to conductive electrodes and conductive layers, respectively. The flip chip 4 serves as a semiconductor chip.

Although particular embodiments of the present invention have been shown and described, it will be apparent to those skilled in the art that various changes and modifications may be made without departing from the spirit and scope of the present invention.

The printed circuit board does not set a limit on the substrate. For example, a flip chip may be mounted on a flexible film with conductive pattern.

Even if the sharp tails are not formed on the bump electrodes 5, the reliable electrical connection is established in the bump electrodes 5 alloyed with the pads 3 through the method according to the present invention.

The alloying may be carried out without application of heat.

What is claimed is:

1. A method for mounting a semiconductor chip on a substrate, comprising the steps of:
    a) preparing a semiconductor chip having conductive electrodes and a substrate having conductive layers, said conductive electrodes and said conductive layers being formed of material capable of being alloyed with one another;
    b) pressing said conductive electrodes against said conductive layers to form an initial electrical connection by applying a force to said conductive electrodes and maintaining a temperature of at least one of said semiconductor chip and said substrate to shrink a sealing layer covering at least said conductive electrodes and said conductive layers; and
    c) after pressing said conductive electrodes, alloying said material with each other for completing electrical connection between said conductive electrodes and said conductive layers by increasing a temperature of at least one of said semiconductor chip and said substrate for a specified time above said temperature maintained in step (b).

2. The method as set forth in claim 1, in which said sealing layer is shrunk through solidification.

3. The method as set forth in claim 2, in which said solidification is carried out by applying heat to said sealing layer.

4. The method as set forth in claim 3, in which said conductive electrodes are pressed against the conductive layers during the application of said heat so as to prevent said conductive electrodes and said conductive layers from separation due to thermal expansion of said sealing layer.

5. The method as set forth in claim 3, in which said sealing layer is formed of thermally curable synthetic resin.

6. The method as set forth in claim 5, in which said thermally curable synthetic resin has a coefficient of contraction and a coefficient of thermal expansion, and said coefficient of contraction is greater than said coefficient of thermal expansion.

7. The method as set forth in claim 6, in which said thermally curable synthetic resin is selected from an epoxy series.

8. The method as set forth in claim 7, in which said thermally curable synthetic resin is solidified on conditions that heat at least keeps said thermally curable synthetic resin at 200 degrees in centigrade for 30 seconds.

9. The method as set forth in claim 8, in which at least 30 grams of force is applied to each of said conductive electrodes during the solidification of said thermally curable synthetic resin.

10. The method as set forth in claim 1, in which said material is alloyed on conditions that heat is applied between said conductive electrodes and said conductive layers and that said conductive electrodes are pressed against said conductive layers.

11. The method as set forth in claim 10, in which said material is alloyed through a thermal diffusion.

12. The method as set forth in claim 10, in which 50 grams of force is exerted on each of said conductive electrodes in the alloying, and said semiconductor chip and said substrate are respectively maintained around 300 degrees in centigrade and around 100 degrees in centigrade for at least 5 seconds in said alloying.

13. The method as set forth in claim 11, in which said material is gold.

14. The method as set forth in claim 13, in which said conductive electrodes are formed of said gold, and said conductive layers have respective layers formed of said gold.

15. The method as set forth in claim 14, in which said conductive layers have a laminated structure where copper layers are overlaid by nickel layers covered with said layers formed of said gold.

16. The method as set forth in claim 1, in which said step b) includes the sub-steps of b-1) spreading sealing material on an area of said substrate where said conductive layers occupy, b-2) aligning said conductive electrodes with said conductive layers, b-3) bringing said conductive electrodes into contact with said conductive layers, and b-4) solidifying said sealing material so as to press said conductive electrodes against said conductive layers.

17. The method as set forth in claim 16, in which a force is exerted on each of said conductive electrode in said sub-step b-4) so as to prevent said conductive electrodes and said conductive layers from separation.

18. The method as set forth in claim 16, in which said conductive electrodes are formed with tails so that said tails pushes said sealing material aside in said sub-step b-3).

19. The method as set forth in claim 1, in which a flip chip mounting system equipped with heaters is used in said step b) for keeping said semiconductor chip and said substrate at target temperatures, and a press machine equipped with heaters is used in said step c) for keeping said semiconductor chip and said substrate at other target temperatures different from said target temperatures.

20. The method as set forth in claim 1, in which a flip chip mounting system is used so as to heat said semiconductor chip and said substrate to predetermined temperatures in said step b) and to other predetermined temperatures different from said predetermined temperatures in said step c).

21. The method as set forth in claim 1, wherein said material is a metal.

22. The method as set forth in claim 1, further comprising application of an increased force to said conductive electrodes in step (c) that is greater than the force applied in step (b).

23. The method as set forth in claim 1, wherein steps (b) and (c) utilize a pulse heating flip chip mounting system to achieve said pressing and alloying of the conductive electrodes to the conductive layers.

24. The method as set forth in claim 23, wherein said pulse heating flip chip mounting system provides a desired schedule of temperatures and pressures during steps (b) and (c).

* * * * *